US011152521B2

United States Patent
Fuyuki et al.

(10) Patent No.: US 11,152,521 B2
(45) Date of Patent: Oct. 19, 2021

(54) SEMICONDUCTOR LAMINATE AND LIGHT-RECEIVING ELEMENT

(71) Applicant: SUMITOMO ELECTRIC INDUSTRIES, LTD., Osaka (JP)

(72) Inventors: Takuma Fuyuki, Osaka (JP); Takashi Go, Osaka (JP); Takashi Ishizuka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 116 days.

(21) Appl. No.: 16/676,942

(22) Filed: Nov. 7, 2019

(65) Prior Publication Data
US 2020/0227576 A1    Jul. 16, 2020

(30) Foreign Application Priority Data

Jan. 15, 2019  (JP) .................................. 2019-004259

(51) Int. Cl.
| | |
|---|---|
| *H01L 31/00* | (2006.01) |
| *H01L 31/0352* | (2006.01) |
| *H01L 31/109* | (2006.01) |
| *H01L 31/0304* | (2006.01) |

(52) U.S. Cl.
CPC ............ *H01L 31/035236* (2013.01); *H01L 31/03046* (2013.01); *H01L 31/109* (2013.01)

(58) Field of Classification Search
CPC ....... H01L 31/035236; H01L 31/03046; H01L 31/109
See application file for complete search history.

(56) References Cited

U.S. PATENT DOCUMENTS

| | | |
|---|---|---|
| 2011/0140082 A1 | 6/2011 | Iguchi et al. |
| 2012/0223290 A1 | 9/2012 | Iguchi et al. |
| 2016/0247951 A1* | 8/2016 | Fujii ................... H01L 21/0262 |

FOREIGN PATENT DOCUMENTS

JP     2011-101032 A     5/2011

OTHER PUBLICATIONS

R. Sidhu, et al., "A Long-Wavelength Photodiode on InP Using Lattice-Matched GaInAs—GaAsSb Type-II Quantum Wells", IEEE Photonics Technology Letters, vol. 17, No. 12, Dec. 2005, pp. 2715-2717.

* cited by examiner

*Primary Examiner* — Nictor A Mandala
*Assistant Examiner* — Colleen E Snow
(74) *Attorney, Agent, or Firm* — Oliff PLC

(57) ABSTRACT

A semiconductor laminate includes a substrate composed of InP, a first buffer layer composed of InP containing less than $1\times10^{21}$ cm$^{-3}$ Sb and disposed on the substrate, and a second buffer layer composed of InGaAs and disposed on the first buffer layer. The first buffer layer includes a first layer that has a higher concentration of Sb than the substrate and that is arranged to include a first main surface which is a main surface of the first buffer layer on the substrate side. The second buffer layer includes a second layer that has a lower concentration of Sb than the first layer and that is arranged to include a second main surface which is a main surface of the second buffer layer on the first buffer layer side.

17 Claims, 8 Drawing Sheets

SEMICONDUCTOR LAMINATE AND LIGHT-RECEIVING ELEMENT

CROSS REFERENCE TO RELATED APPLICATIONS

The present disclosure claims priority based on Japanese Patent Application No. 2019-4259 filed on Jan. 15, 2019, and the entire contents of this Japanese Patent Application are herein incorporated by reference.

BACKGROUND

The present disclosure relates to a semiconductor laminate and a light-receiving element.

Semiconductor laminates composed of III-V compound semiconductors can be used to produce light-receiving elements adaptable to infrared light. Specifically, an InGaAs buffer layer, a light-receiving layer, and a contact layer are sequentially stacked on an InP substrate, for example, and appropriate electrodes are further formed, to obtain a light-receiving element for infrared light (see, for example, Japanese Patent Application Laid-Open No. 2011-101032). As one of such light-receiving elements, a photodiode having a cutoff wavelength of 2 μm to 5 μm has been reported (see, for example, R. Sidhu, et al., "A Long-Wavelength Photodiode on InP Using Lattice-Matched GaInAs—GaAsSb Type-II Quantum Wells", IEEE PHOTONICS TECHNOLOGY LETTERS, VOL. 17, NO. 12, DECEMBER 2005, pp. 2715-2717).

SUMMARY

A semiconductor laminate according to the present disclosure includes: a substrate composed of InP; a first buffer layer composed of InP containing less than $1\times10^{21}$ cm$^{-3}$ Sb and disposed on the substrate; and a second buffer layer composed of InGaAs and disposed on the first buffer layer. The first buffer layer includes a first layer that has a higher concentration of Sb than the substrate and that is arranged to include a first main surface as a main surface of the first buffer layer on the substrate side. The second buffer layer includes a second layer that has a lower concentration of Sb than the first layer and that is arranged to include a second main surface as a main surface of the second buffer layer on the first buffer layer side.

BRIEF DESCRIPTION OF DRAWINGS

The foregoing and other purposes, aspects and advantages will be better understood from the following detailed description of preferred embodiments of the invention with reference to the drawings, in which.

DESCRIPTION OF EMBODIMENTS

Figure 1:
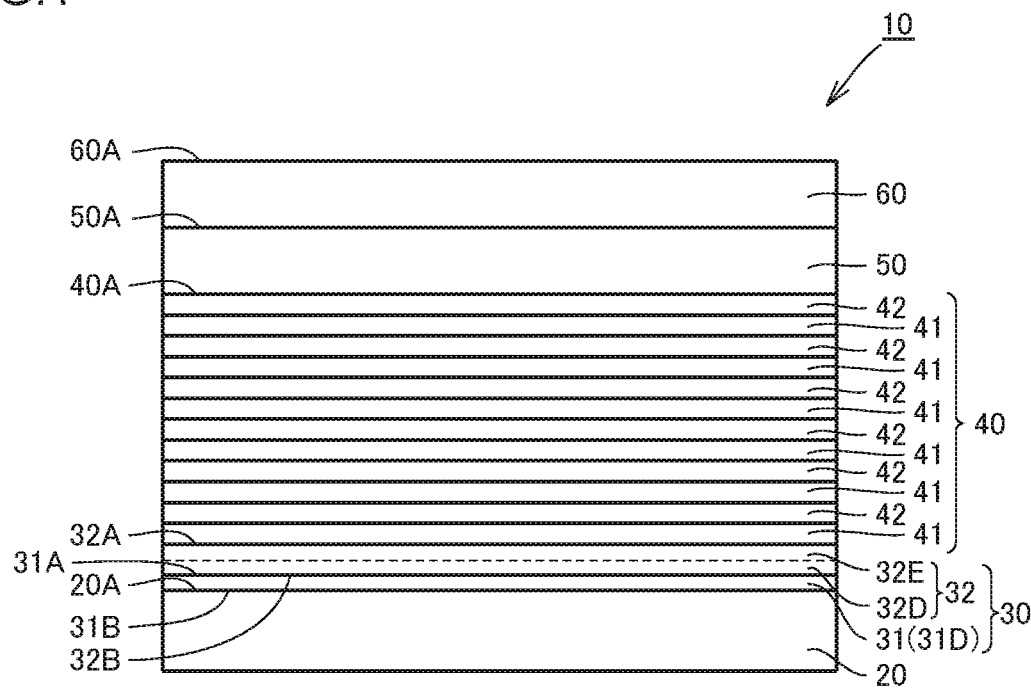
FIG. 1 is a schematic cross-sectional view showing the structure of a semiconductor laminate in Embodiment 1.

Description of Embodiments of the Present Disclosure

In order to ensure good crystallinity of a light-receiving layer which will considerably affect the performance of the light-receiving element, it is necessary to impart good surface flatness to the InGaAs buffer layer serving as the underlayer of the light-receiving layer. Thus, an object is to provide a semiconductor laminate and a light-receiving element that include an InGaAs buffer layer having excellent surface flatness.

The present disclosure can provide a semiconductor laminate and a light-receiving element that include an InGaAs buffer layer having excellent surface flatness.

Embodiments of the present disclosure will be listed and described first. A semiconductor laminate of the present disclosure includes a substrate composed of indium phosphide (InP), a first buffer layer composed of InP containing less than $1\times10^{21}$ cm$^{-3}$ Sb and disposed on the substrate, and a second buffer layer composed of indium gallium arsenide (InGaAs) and disposed on the first buffer layer. The first buffer layer includes a first layer that has a higher concentration of Sb than the substrate and that is arranged to include a first main surface which is a main surface of the first buffer layer on the substrate side. The second buffer layer includes a second layer that has a lower concentration of Sb than the first layer and that is arranged to include a second main surface which is a main surface of the second buffer layer on the first buffer layer side.

The present inventors studied the way of forming an InGaAs buffer layer while ensuring excellent surface flatness, and have found that the surface flatness can be improved in the following manner. A first buffer layer composed of InP containing Sb is formed on a substrate composed of InP. In forming the first buffer layer, a first layer having a high concentration of Sb is formed to include a first main surface as the main surface on the substrate side. Introducing Sb in the region coming into contact with the substrate makes it possible to obtain a first buffer layer excellent in surface flatness. The reasons why the surface flatness of the first buffer layer is improved are conceivably for example as follows. When the first layer is formed in the first buffer layer, a crystal nucleus including Sb is formed easily on the substrate. This crystal nucleus serves as the starting point to facilitate two-dimensional growth of InP, so that a first buffer layer having good surface flatness is formed. A second buffer layer composed of InGaAs is formed on the first buffer layer. In forming the second buffer layer, a second layer having a lower concentration of Sb than the first layer is formed to include a second main surface as the main surface on the first buffer layer side. The second buffer layer is formed, not directly on the InP substrate, but on the first buffer layer, and the concentration of unnecessary Sb in the region coming into contact with the first buffer layer is reduced, whereby the second buffer layer of InGaAs excellent in surface flatness is formed. Accordingly, the semiconductor laminate of the present disclosure provides a semiconductor laminate that includes an InGaAs buffer layer having excellent surface flatness.

In the semiconductor laminate described above, the concentration of Sb in the first layer may be $1\times10^{16}$ cm$^{-3}$ or more. Setting the Sb concentration in the first layer within this range more reliably ensures excellent surface flatness of the second buffer layer.

In the semiconductor laminate described above, the concentration of Sb in the first layer may be $1\times10^{17}$ cm$^{-3}$ or more. This ensures further improved surface flatness of the second buffer layer.

In the semiconductor laminate described above, the concentration of Sb in the second layer may be $1\times10^{20}$ cm$^{-3}$ or less. Setting the Sb concentration in the second layer within this range more reliably ensures excellent surface flatness of the second buffer layer.

In the semiconductor laminate described above, in the Sb concentration distribution in the thickness direction of the first buffer layer, the ratio of a difference between a maximum value and a minimum value of the Sb concentration with respect to the maximum value may be 50% or less. Setting the ratio to 50% or less enables forming the first buffer layer having favorable surface flatness. It is therefore possible to more reliably ensure excellent surface flatness of the second buffer layer.

In the semiconductor laminate described above, the first buffer layer may have a thickness of 10 nm or more and 50 nm or less. If the thickness of the first buffer layer is less than 10 nm, the effect of improving the surface flatness of the second buffer layer may be small. If the thickness of the first buffer layer exceeds 50 nm, it may be difficult to ensure sufficient surface flatness of the first buffer layer. Setting the thickness of the first buffer layer within the above-described range can more reliably ensure excellent surface flatness of the second buffer layer.

The semiconductor laminate described above may further include a light-receiving layer composed of a III-V compound semiconductor and disposed on the second buffer layer. With such a light-receiving layer provided, it is possible to obtain a semiconductor laminate that can be used for producing a light-receiving element.

In the semiconductor laminate described above, the light-receiving layer may have a type-II quantum well structure. With this, it is possible to obtain a semiconductor laminate that can be used for producing a light-receiving element adaptable to infrared light.

In the semiconductor laminate described above, the type-II quantum well structure may be a multiple quantum well structure including pairs of layers of $In_xGa_{1-x}As$ (where x is 0.38 or more and 1 or less) and gallium arsenide antimonide ($GaAs_{1-y}Sb_y$; where y is 0.36 or more and 1 or less), or pairs of layers of gallium indium nitride arsenide ($Ga_{1-u}In_uN_vAs_{1-v}$; where u is 0.4 or more and 0.8 or less, and v is more than 0 and not more than 0.2) and $GaAs_{1-y}Sb_y$ (where y is 0.36 or more and 0.62 or less). This facilitates forming the light-receiving layer that has the type-II quantum well structure suitable for a light-receiving element adaptable to near-infrared to mid-infrared light.

A light-receiving element of the present disclosure includes the semiconductor laminate described above, and electrodes formed on the semiconductor laminate. The light-receiving element of the present disclosure includes the above-described semiconductor laminate having the second buffer layer excellent in surface flatness. This ensures excellent crystallinity of the light-receiving layer. As a result, the dark current in the light-receiving element is reduced. Accordingly, the light-receiving element of the present disclosure provides a highly sensitive light-receiving element.

It should be noted that in each layer of the present disclosure, the concentration of Sb can be measured using secondary ion mass spectrometry (SIMS), for example. The Sb concentration takes a value obtained, for example, by dividing the integral value of the concentration distribution in the thickness direction in each layer by the thickness of that layer.

Details of Embodiments of the Present Disclosure

Embodiments of the semiconductor laminate according to the present disclosure will be described below with reference to the drawings. In the drawings below, the same or corresponding elements are denoted by the same reference numerals, and the description thereof will not be repeated.

Embodiment 1

Referring to FIG. 1, a semiconductor laminate 10 according to Embodiment 1 includes a substrate 20, a buffer layer 30, a light-receiving layer 40, a block layer 50, and a contact layer 60.

The substrate 20 is composed of InP which is a III-V compound semiconductor. The substrate 20 has a diameter of 50 mm or more, for example three inches. Adopting the substrate 20 composed of InP makes it possible to readily obtain a semiconductor laminate 10 suitable for producing a light-receiving element for infrared light. Specifically, InP having an n-type conductivity (n-InP), for example, is adopted as the compound semiconductor forming the substrate 20. The n-type impurity contained in the substrate 20 may be sulfur (S), for example. For the purposes of improving the production efficiency and yield of the semiconductor device (light-receiving element) using the semiconductor laminate 10, the diameter of the substrate 20 may be 80 mm or more (for example, four inches), further 105 mm or more (for example, five inches), and still further 130 mm or more (for example, six inches).

The buffer layer 30 includes a first buffer layer 31, and a second buffer layer 32 disposed on the first buffer layer 31. The first buffer layer 31 is a semiconductor layer disposed on and in contact with one main surface 20A of the substrate 20. The first buffer layer 31 is composed of InP which is a III-V compound semiconductor. Specifically, InP having an n-type conductivity (n-InP), for example, is adopted as the compound semiconductor forming the first buffer layer 31. The n-type impurity contained in the first buffer layer 31 may be silicon (Si), for example. In the present embodiment, the first buffer layer 31 has a thickness of, for example, 10 nm or more and 50 nm or less, more preferably 10 nm or more and 30 nm or less, and further preferably 10 nm or more and 20 nm or less.

The first buffer layer 31 contains less than $1\times10^{21}$ cm$^{-3}$ Sb. The first buffer layer 31 includes a first layer 31D having a higher concentration of Sb than the substrate 20. The first layer 31D is arranged to include a first main surface 31B which is a main surface of the first buffer layer 31 on the substrate 20 side. In the present embodiment, the first buffer layer 31 as a whole corresponds to the first layer 31D. In the present embodiment, the concentration of Sb in the first layer 31D is $1\times10^{16}$ cm$^{-3}$ or more, and more preferably $1\times10^{17}$ cm$^{-3}$ or more. The concentration of Sb in the first layer 31D is preferably $1\times10^{20}$ cm$^{-3}$ or less.

Here, the concentration of Sb takes a value obtained by dividing the integral value of the concentration distribution in the thickness direction of each layer, measured using SIMS, by the thickness of that layer. For example, SIMS is used to perform measurement of the Sb concentration distribution in the thickness direction in three positions. The concentration of Sb is calculated for each layer in those positions, and their average value is considered as the Sb concentration in that layer. For the SIMS measurement, a method of performing measurement from the substrate 20 side (backside SIMS) may be used. Measurement performed using such a method enables more accurate measurement of the Sb concentration distribution in the thickness direction.

The second buffer layer 32 is a semiconductor layer disposed on and in contact with a main surface 31A of the first buffer layer 31 on the side opposite to the first main surface 31B. The second buffer layer 32 is composed of InGaAs which is a ternary III-V compound semiconductor. Specifically, InGaAs having an n-type conductivity (n-InGaAs), for example, is adopted as the compound semiconductor forming the second buffer layer 32. The n-type impurity contained in the second buffer layer 32 may be Si, for example.

The second buffer layer 32 includes a second layer 32D having a lower concentration of Sb than the first layer 31D. The second layer 32D is arranged to include a second main surface 32B which is a main surface of the second buffer layer 32 on the first buffer layer 31 side. The second buffer layer 32 has a fourth layer 32E in a region other than the second layer 32D coming into contact with the first buffer layer 31. When the concentration of Sb is $1 \times 10^{20}$ cm$^{-3}$ or less, it is determined that the second layer 32D has been formed. In the present embodiment, the concentration of Sb in the second layer 32D is preferably $1 \times 10^{17}$ cm$^{-3}$ or less, and more preferably $1 \times 10^{16}$ cm$^{-3}$ or less. The second buffer layer 32 in the present embodiment has a thickness of 100 nm or more and 200 nm or less, for example.

The light-receiving layer 40 is disposed on and in contact with a main surface 32A of the second buffer layer 32 on the side opposite to the second main surface 32B. The light-receiving layer 40 has a quantum well structure having two element layers of III-V compound semiconductors stacked alternately. More specifically, the light-receiving layer 40 has a structure in which first element layers 41 and second element layers 42 are alternately stacked. The light-receiving layer 40 in the present embodiment has a type-II quantum well structure. The material forming the first element layer 41 may be, for example, $In_xGa_{1-x}As$ (where x is 0.38 or more and 1 or less). The first element layer 41 is a layer in which Sb is not added intentionally (during its growth, no Sb source gas is intentionally added to the source gases). The material forming the second element layer 42 may be, for example, $GaAs_{1-y}Sb_y$ (where y is 0.36 or more and 1 or less) containing Sb as a group V element. It should be noted that the materials for the first element layer 41 and the second element layer 42 are not limited to those described above. For example, the material forming the first element layer 41 may be $Ga_{1-u}In_uN_vAs_{1-v}$ (where u is 0.4 or more and 0.8 or less, and v is more than 0 and not more than 0.2), and the material forming the second element layer 42 may be $GaAs_{1-y}Sb_y$ (where y is 0.36 or more and 0.62 or less) containing Sb as a group V element, for example.

Adopting such a multiple quantum well structure including the pairs of layers of $In_xGa_{1-x}As$ (where x is 0.38 or more and 1 or less) and $GaAs_{1-y}Sb_y$ (where y is 0.36 or more and 1 or less), or the pairs of layers of $Ga_{1-u}In_uN_vAs_{1-v}$ (where u is 0.4 or more and 0.8 or less and v is more than 0 and not more than 0.2) and $GaAs_{1-y}Sb_y$ (where y is 0.36 or more and 0.62 or less), as the light-receiving layer 40 makes it possible to obtain a semiconductor laminate 10 that can be used for producing a light-receiving element suitable for detection of near-infrared to mid-infrared light.

The first element layer 41 and the second element layer 42 may each have a thickness of 5 nm, for example. The light-receiving layer 40 may have a stack of, for example, 250 unit structures each composed of a pair of the first element layer 41 and the second element layer 42. In other words, the light-receiving layer 40 may have a thickness of 2.5 µm, for example.

Further, InAs may be adopted as the material forming the first element layer 41, and GaSb as the material forming the second element layer 42. By adopting such a multiple quantum well structure that includes the pairs of layers of InAs and GaSb as the light-receiving layer 40, it is possible to obtain a semiconductor laminate 10 that can be used for producing a light-receiving element suitable for detection of infrared light having a wavelength of 4 µm to 12 µm.

Referring to FIG. 1, the block layer 50 is disposed on and in contact with a main surface 40A of the light-receiving layer 40 on the side opposite to the side facing the second buffer layer 32. The block layer 50 is composed of a III-V compound semiconductor.

The III-V compound semiconductor forming the block layer 50 may be InGaAs, for example. Specifically, undoped InGaAs (ud-InGaAs), for example, is adopted as the compound semiconductor forming the block layer 50. The block layer 50 disposed suppresses diffusion of impurity contained in the contact layer 60 to the light-receiving layer 40.

Referring to FIG. 1, the contact layer 60 is disposed on and in contact with a main surface 50A of the block layer 50 on the side opposite to the side facing the light-receiving layer 40. The contact layer 60 is composed of a III-V compound semiconductor.

The III-V compound semiconductor forming the contact layer 60 may be, for example, InP, InAs, GaSb, GaAs, or InGaAs. Specifically, InP having a p conductivity (p-InP), for example, is adopted as the compound semiconductor forming the contact layer 60. The p-type impurity contained in the contact layer 60 may be Zn, for example.

In the present embodiment, the first buffer layer 31 composed of InP containing Sb is formed on the substrate 20 composed of InP. In forming the first buffer layer 31, the first layer 31D having a high concentration of Sb is formed to include the first main surface 31B. Introducing Sb into the region coming into contact with the substrate 20 enables forming the first buffer layer 31 excellent in surface flatness.

The second buffer layer 32 composed of InGaAs is then formed on the first buffer layer 31. In forming the second buffer layer 32, the second layer 32D having a lower concentration of Sb than the first layer 31D is formed to include the second main surface 32B. With the second buffer layer 32 formed on the first buffer layer 31, instead of being formed directly on the substrate 20 composed of InP, and with the decreased concentration of unnecessary Sb in the region coming into contact with the first buffer layer 31, the second buffer layer 32 excellent in surface flatness is formed. Accordingly, the semiconductor laminate 10 of the present embodiment is a semiconductor laminate including the InGaAs second buffer layer 32 having excellent surface flatness.

In the embodiment described above, the first layer 31D has the concentration of Sb of $1 \times 10^{16}$ cm$^{-3}$ or more. Setting the Sb concentration in the first layer 31D within this range more reliably ensures excellent surface flatness of the second buffer layer 32. The concentration of Sb in the first layer 31D is more preferably $1 \times 10^{17}$ cm$^{-3}$ or more. This can further improve the surface flatness of the second buffer layer 32.

In the embodiment described above, the second layer 32D has the concentration of Sb of $1 \times 10^{20}$ cm$^{-3}$ or less. Setting the Sb concentration in the second layer 32D within this range more reliably ensures excellent surface flatness of the second buffer layer 32.

In the embodiment described above, in the concentration distribution of Sb in the thickness direction of the first buffer layer 31, the ratio of a difference between a maximum value and a minimum value of the Sb concentration with respect to the maximum value is 50% or less. Setting the ratio to 50% or less enables forming the first buffer layer 31 having favorable surface flatness. It is therefore possible to more reliably ensure excellent surface flatness of the second buffer layer 32. The above-described ratio is preferably 20% or less, and further preferably 10% or less. The determination whether the ratio is 50% or less is made for example in the following manner. SIMS is used to perform linear analysis of the Sb concentration in the thickness direction in three positions, for example. The ratio of the difference between the maximum value and the minimum value of the Sb concentration to the maximum value is calculated for each position. When their average value is 50% or less, the condition is determined to be satisfied.

In the embodiment described above, the first buffer layer 31 has a thickness of 10 nm or more and 50 nm or less. If the thickness of the first buffer layer 31 is less than 10 nm, the effect of improving the surface flatness of the second buffer layer 32 may be small. If the thickness of the first buffer layer 31 exceeds 50 nm, it may be difficult to ensure sufficient surface flatness of the first buffer layer 31. Setting the thickness of the first buffer layer 31 within the above-described range more reliably ensures excellent surface flatness of the second buffer layer 32.

In the semiconductor laminate 10, the buffer layer 30, the light-receiving layer 40, the block layer 50, and the contact layer 60 are preferably stacked on the substrate 20, without formation of any regrowth interface. This can further improve the sensitivity.

In the semiconductor laminate 10, the concentrations of oxygen, carbon, and hydrogen in the interface between the buffer layer 30 and the light-receiving layer 40, the interface between the light-receiving layer 40 and the block layer 50, and the interface between the block layer 50 and the contact layer 60 are each preferably $1 \times 10^{17}$ cm$^{-3}$ or less. This can further improve the sensitivity.

Further, in the semiconductor laminate 10, the buffer layer 30, the light-receiving layer 40, the block layer 50, and the contact layer 60 are preferably formed by metalorganic vapor phase epitaxy (MOVPE). This facilitates obtaining the semiconductor laminate 10 composed of high-quality crystals.

Modification

Figure 3:
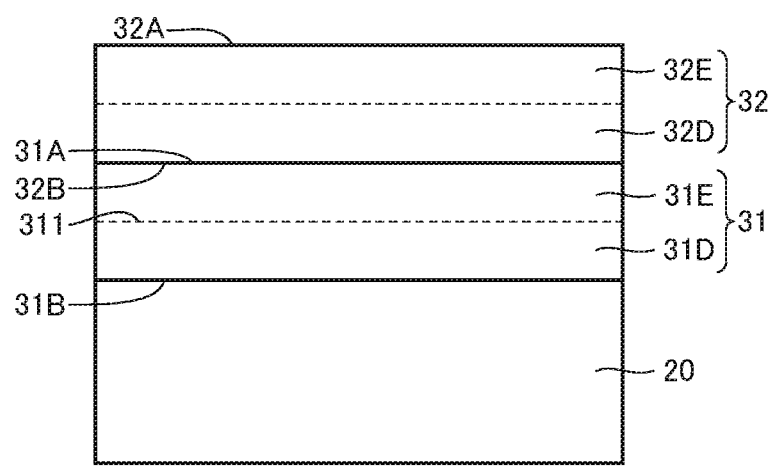
FIG. 3 is a schematic cross-sectional view showing the structure of a modified example in Embodiment 1.

The first layer 31D may be formed as the entirety of the first buffer layer 31, or it may be formed as a portion in the thickness direction. FIG. 3 illustrates a modified example of the semiconductor laminate 10 in the present embodiment. Referring to FIG. 3, the first layer 31D is formed in a portion in the thickness direction. In the first buffer layer 31, a third layer 31E having a lower concentration of Sb than the first layer 31D is arranged on and in contact with a main surface 311 of the first layer 31D on the side opposite to the side facing the substrate. As explained above, it is important to arrange the first layer 31D having a high concentration of Sb in the region coming into contact with the substrate 20 from the standpoint of improving the surface flatness of the first buffer layer 31. This means that the first buffer layer 31 does not necessarily have to be the first layer 31D as a whole. It is possible to form the first buffer layer 31 having excellent surface flatness even when adopting the structure in which the first layer 31D is formed only in the portion coming into contact with the substrate 20.

Figure 2:
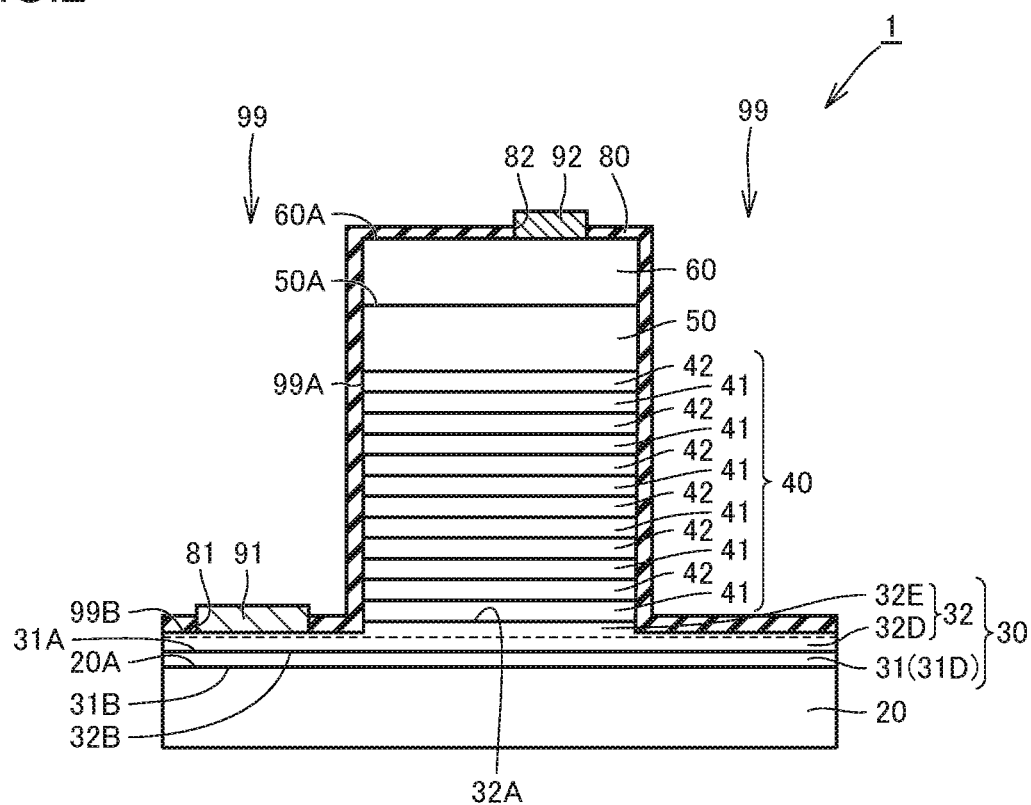
FIG. 2 is a schematic cross-sectional view showing the structure of a light-receiving element in Embodiment 1.

A description will now be given of an infrared light-receiving element (photodiode) as an example of the light-receiving element produced using the semiconductor laminate 10 described above. Referring to FIG. 2, an infrared light-receiving element 1 in the present embodiment is produced using the semiconductor laminate 10 in the present embodiment, and includes: a substrate 20, a buffer layer 30, a light-receiving layer 40, a block layer 50, and a contact layer 60 stacked as in the semiconductor laminate 10. The infrared light-receiving element 1 has a trench 99 formed to penetrate through the contact layer 60, the block layer 50, and the light-receiving layer 40, to reach the buffer layer 30. This means that the contact layer 60, the block layer 50, and the light-receiving layer 40 are exposed on a side wall 99A of the trench 99. The trench 99 has a bottom wall 99B located in the second buffer layer 32. That is, the second buffer layer 32 is exposed on the bottom wall 99B of the trench 99.

The infrared light-receiving element 1 further includes a passivation film 80, an n-electrode 91, and a p-electrode 92. The passivation film 80 is disposed to cover the bottom wall 99B of the trench 99, the side wall 99A of the trench 99, and a main surface 60A of the contact layer 60 on the side opposite to the side facing the block layer 50. The passivation film 80 is composed of an insulator such as silicon nitride or silicon oxide.

The passivation film 80 covering the bottom wall 99B of the trench 99 has an opening 81 formed to penetrate through the passivation film 80 in the thickness direction. An n-electrode 91 is disposed to fill in the opening 81. The n-electrode 91 is disposed to contact the second buffer layer 32 exposed at the opening 81. The n-electrode 91 is composed of an electric conductor such as metal. More specifically, the n-electrode 91 may be composed of titanium (Ti)/platinum (Pt)/gold (Au), for example. The n-electrode 91 is in ohmic contact with the buffer layer 30.

The passivation film 80 covering the main surface 60A of the contact layer 60 has an opening 82 formed to penetrate through the passivation film 80 in the thickness direction. A p-electrode 92 is disposed to fill in the opening 82. The p-electrode 92 is disposed to contact the contact layer 60 exposed at the opening 82. The p-electrode 92 is composed of an electric conductor such as metal. More specifically, the p-electrode 92 may be composed of Ti/Pt/Au, for example. The p-electrode 92 is in ohmic contact with the contact layer 60.

When infrared rays enter this infrared light-receiving element 1, the infrared rays are absorbed between quantum levels in the light-receiving layer 40, resulting in generation of electron-hole pairs. The electrons and holes thus generated are output as photocurrent signals from the infrared light-receiving element 1, whereby the infrared rays are detected.

It should be noted that the p-electrode 92 is a pixel electrode. The infrared light-receiving element 1 may include only one p-electrode 92 as the pixel electrode as shown in FIG. 2, or it may include two or more pixel electrodes (p-electrodes 92). Specifically, the infrared light-receiving element 1 may have a structure in which, with the structure shown in FIG. 2 as a unit structure, a plurality of such unit structures are repeated in the direction along the one main surface 20A of the substrate 20 in FIG. 2. In this case, the infrared light-receiving element 1 has a plurality of p-electrodes 92 corresponding to pixels, while it has only one n-electrode 91 disposed. Such a structure will be described later in Embodiment 2.

The infrared light-receiving element 1 of the present embodiment includes the semiconductor laminate 10 of the present embodiment described above. This ensures excellent crystallinity of the light-receiving layer 40. As a result, the dark current in the infrared light-receiving element 1 is reduced. Accordingly, the infrared light-receiving element 1 of the present embodiment provides a highly sensitive light-receiving element.

A method of producing a semiconductor laminate 10 and an infrared light-receiving element 1 in the present embodiment will now be outlined with reference to FIGS. 4 to 10.

Figure 4:
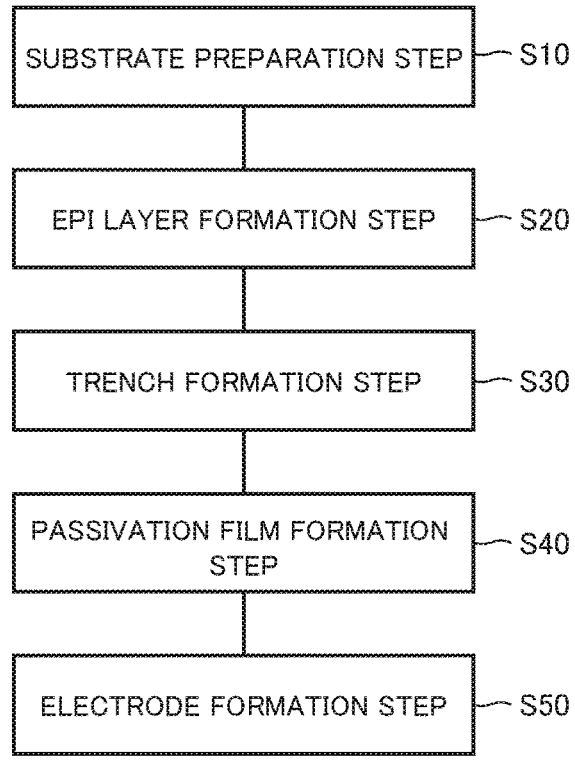
FIG. 4 is a flowchart schematically illustrating a method for producing a semiconductor laminate and a light-receiving element in Embodiment 1.

Referring to FIG. 4, in the method of producing the semiconductor laminate 10 and the infrared light-receiving element 1 in the present embodiment, a substrate preparation step is firstly performed as a step S10. In this step S10, referring to FIG. 6, a substrate 20 of n-InP having a diameter of two inches (50.8 mm), for example, is prepared. More specifically, an ingot of InP is sliced to obtain a substrate 20 of InP. A surface of the substrate 20 is polished and then subjected to cleaning and other processes, whereby the substrate 20 having the main surface 20A for which flatness and cleanliness are ensured is prepared.

Figure 5:
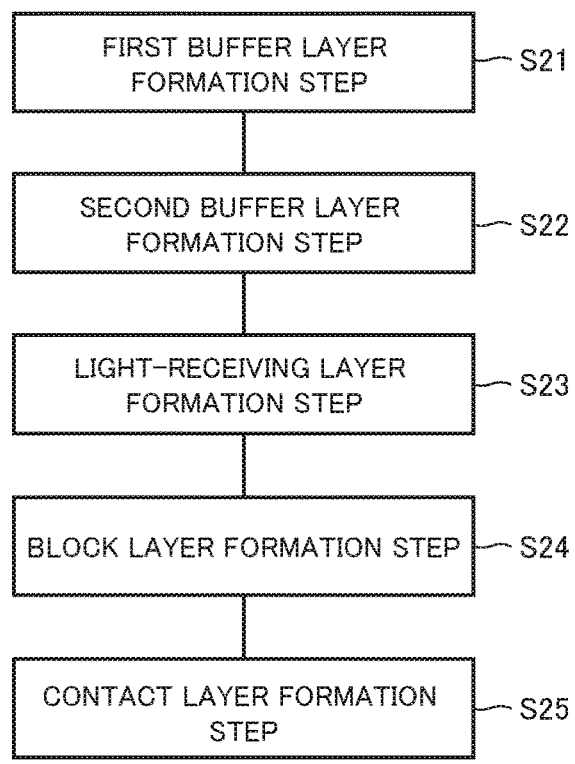
FIG. 5 is a flowchart schematically illustrating the procedure of an epi layer formation step in Embodiment 1.
Figure 6:
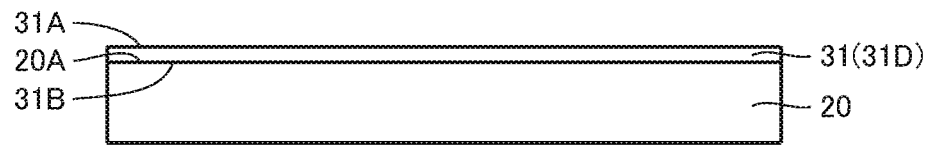
FIGS. 6 to 10 are schematic cross-sectional views illustrating the method for producing a semiconductor laminate and a light-receiving element in Embodiment 1.
Figure 7:
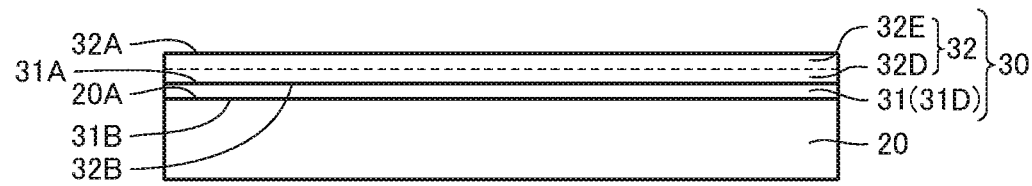
Figure 8:
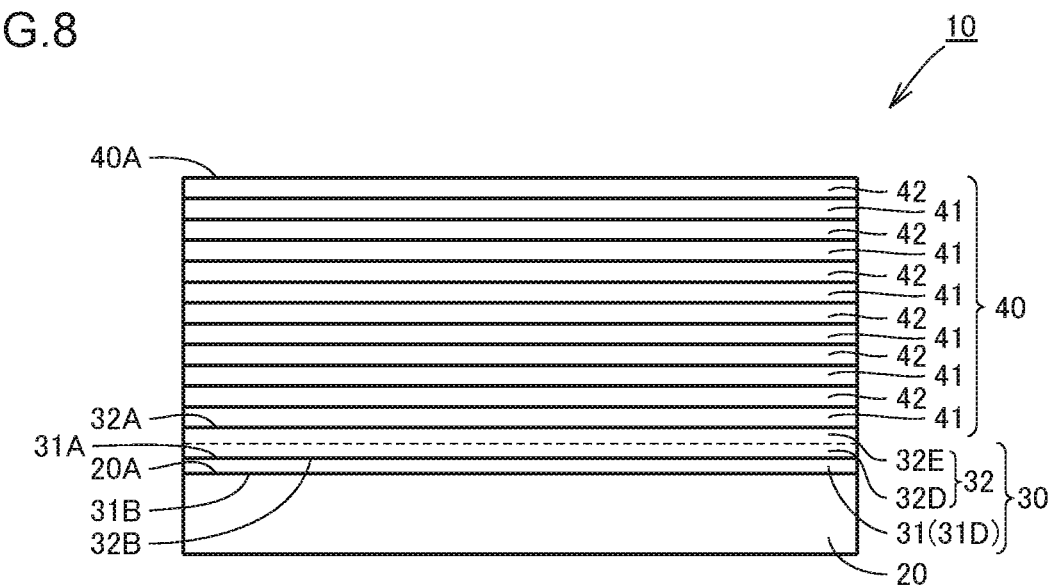
Figure 9:
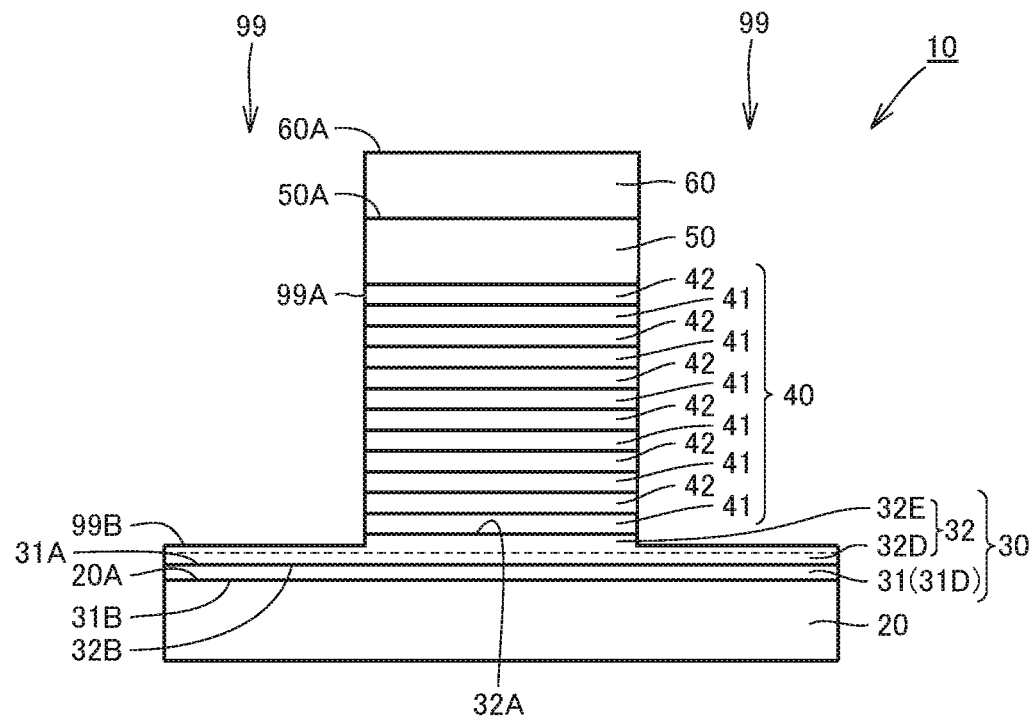
Figure 10:
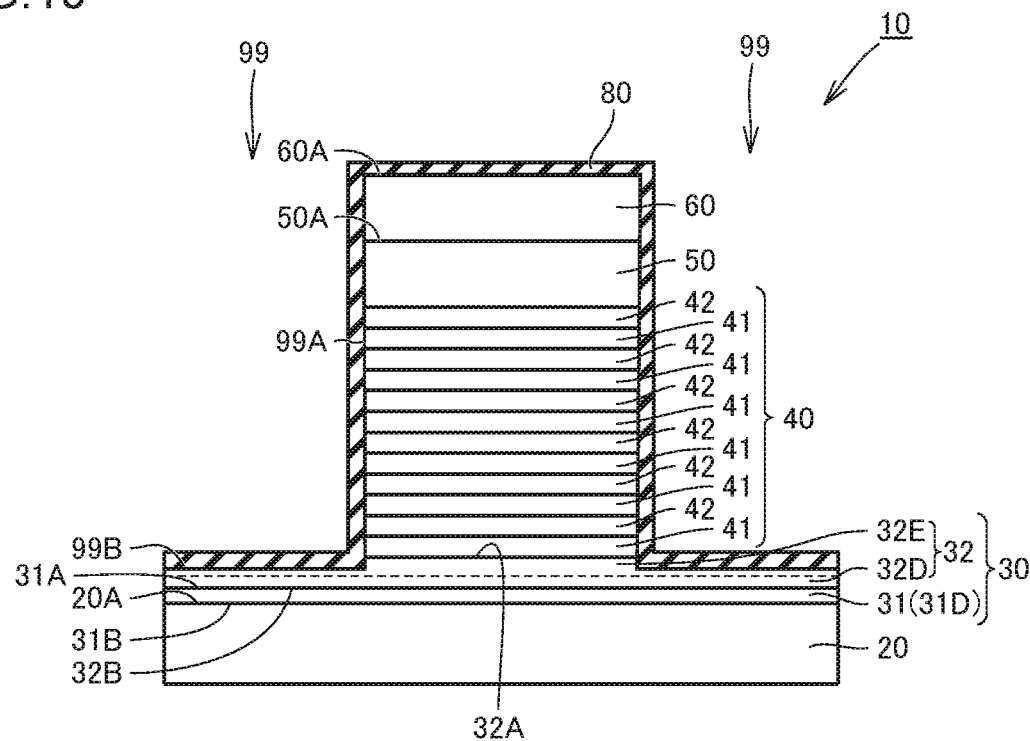

Subsequently, an epi layer formation step is performed as a step S20. In this step S20, a buffer layer 30, a light-receiving layer 40, a block layer 50, and a contact layer 60 as the epi layers are formed on the main surface 20A of the substrate 20 prepared in the step S10. The epi layers can be formed by MOVPE, for example. In forming the epi layers by MOVPE, the substrate 20 can be placed on a rotary table equipped with a heater for heating the substrate, for example, and the source gases are supplied onto the substrate 20 while the substrate is being heated by the heater. Referring to FIG. 5, the step S20 includes a first buffer layer formation step S21, a second buffer layer formation step S22, a light-receiving layer formation step S23, a block layer formation step S24, and a contact layer formation step S25.

In the step S20, the step S21 is performed firstly. Specifically, referring to FIG. 6, a first buffer layer 31 of n-InP is firstly formed by MOVPE on and in contact with the main surface 20A of the substrate 20. In forming the n-InP first buffer layer 31, trimethylindium (TMIn), for example, may be used as the In source gas, and tertiarybutylphosphine (TBP), for example, as the P source gas. When Si is to be added as the n-type impurity, silane ($SiH_4$), monomethylsilane ($SiH_3(CH_3)$), or tetraethylsilane (TeESi), for example, may be added to the source gases.

Here, in the step of forming the first buffer layer 31, a first layer 31D having a higher concentration of Sb than the substrate 20 is formed to include a first main surface 31B. Specifically, in forming the first layer 31D, Sb is introduced so as to attain the concentration of not less than $1\times10^{16}$ cm$^{-3}$ and less than $1\times10^{21}$ cm$^{-3}$. To introduce Sb, trimethylantimony (TMSb), triethylantimony (TESb), triisopropylantimony (TIPSb), trisdimethylaminoantimony (TDMASb), or tritertiarybutylantimony (TTBSb), for example, may be added to the source gases.

Next, the step S22 is performed. Specifically, referring to FIGS. 6 and 7, a second buffer layer 32 of n-InGaAs is formed on and in contact with a main surface 31A of the first buffer layer 31 on the side opposite to the side facing the substrate 20. The second buffer layer 32 may be formed by MOVPE continuously following the formation of the first buffer layer 31. In forming the n-InGaAs second buffer layer 32, TMIn or triethylindium (TEIn), for example, may be used as the In source gas, triethylgallium (TEGa) or trimethylgallium (TMGa), for example, as the Ga source gas, and arsine ($AsH_3$), tertiarybutylarsine (TBAs), or trimethylarsenic (TMAs), for example, as the As source gas. When Si is to be added as the n-type impurity, $SiH_4$, $SiH_3(CH_3)$, or TeESi, for example, may be added to the source gases.

In the step of forming the second buffer layer 32, a second layer 32D having a lower concentration of Sb than the first layer 31D is formed to include a second main surface 32B. Specifically, Sb is not introduced while the second layer 32D is being formed. As a result, the second layer 32D having the Sb concentration of $1\times10^{20}$cm$^{-3}$ or less is formed.

Next, the step S23 is performed. Specifically, referring to FIGS. 7 and 8, on and in contact with a main surface 32A of the second buffer layer 32 on the side opposite to the second main surface 32B, first element layers 41 of $In_xGa_{1-x}As$ (where x is 0.38 or more and 1 or less) as a III-V compound semiconductor and second element layers 42 of $GaAs_{1-y}Sb_y$ (where y is 0.36 or more and 1 or less) as a III-V compound semiconductor, for example, are alternately stacked to form the light-receiving layer 40. The light-receiving layer 40 may be formed by MOVPE continuously following the formation of the second buffer layer 32. Specifically, with the substrate 20 placed within the device that has been used for forming the second buffer layer 32, the source gases are replaced to form the light-receiving layer 40.

In forming the first element layer 41 of $In_xGa_{1-x}As$ (where x is 0.38 or more and 1 or less), TMIn or TEIn, for example, may be used as the In source, TEGa or TMGa, for example, as the Ga source, and TBAs or TMAs, for example, as the As source. In forming the second element layer 42 of $GaAs_{1-y}Sb_y$ (where y is 0.36 or more and 1 or less), TEGa or TMGa, for example, may be used as the Ga source, TBAs or TMAs, for example, as the As source, and TMSb, TESb, TIPSb, TDMASb, or TTBSb, for example, as the Sb source. With the first element layer 41 and the second element layer 42 each having a thickness of for example 5 nm, a stack of 250 unit structures, for example, each composed of a pair of the first element layer 41 and the second element layer 42, may be formed. With this, the light-receiving layer 40 as the type-II quantum well is formed.

Next, the step S24 is performed. Specifically, referring to FIGS. 8 and 1, a block layer 50 of ud-InGaAs, for example, is formed on and in contact with a main surface 40A of the light-receiving layer 40 on the side opposite to the side facing the second buffer layer 32. The block layer 50 may be formed by MOVPE continuously following the formation of the light-receiving layer 40. Specifically, with the substrate 20 placed within the device that has been used for forming the light-receiving layer 40, the source gases are replaced to form the block layer 50.

Next, the step S25 is performed. Specifically, referring to FIG. 1, a contact layer 60 of p-InP, for example, is formed on and in contact with a main surface 50A of the block layer 50 on the side opposite to the side facing the light-receiving layer 40. The contact layer 60 may be formed by MOVPE continuously following the formation of the block layer 50. Specifically, with the substrate 20 placed within the device that has been used for forming the block layer 50, the source gases are replaced to form the contact layer 60. When Zn is to be added as the p-type impurity, dimethylzinc (DMZn) or diethylzinc (DEZn), for example, may be added to the source gases.

The above procedure completes the semiconductor laminate 10 in the present embodiment. Performing the step S20 by MOVPE as described above can improve the production efficiency of the semiconductor laminate 10. It should be noted that the step S20 is not limited to MOVPE that uses solely metal-organic sources. MOVPE that uses hydrides, such as $AsH_3$ as the As source and/or $SiH_4$ as the Si source, may also be used, although adopting the MOVPE exclusively using the metal-organic sources can provide the semiconductor laminate 10 made up of high-quality crystals. The step S20 may also be performed by a method other than MOVPE, for example by molecular beam epitaxy (MBE).

Further, it is preferable to perform the steps S21 through S25 continuously, as described above, by replacing the source gases while maintaining the substrate 20 in the device. Specifically, the steps S21 through S25 are preferably performed so as to allow the buffer layer 30, the light-receiving layer 40, the block layer 50, and the contact layer 60 to be stacked without formation of any regrowth interface. With this, the semiconductor laminate 10 contributing to improved sensitivity can be obtained.

Subsequently, referring to FIG. 4, a trench formation step is performed as a step S30. In this step S30, referring to FIGS. 1 and 9, a trench 99 is formed in the semiconductor laminate 10 produced in the steps S10 and S20 above, to penetrate through the contact layer 60, the block layer 50, and the light-receiving layer 40 to reach the buffer layer 30. The trench 99 can be formed by etching, for example, following formation of a mask layer having an opening corresponding to the shape of the trench 99 on a main surface 60A of the contact layer 60.

Subsequently, a passivation film formation step is performed as a step S40. In this step S40, referring to FIGS. 9 and 10, a passivation film 80 is formed on the semiconductor laminate 10 with the trench 99 formed in the step S30. Specifically, the passivation film 80 of an insulator such as silicon oxide or silicon nitride is formed by chemical vapor deposition (CVD), for example. The passivation film 80 is formed to cover a bottom wall 99B of the trench 99, a side wall 99A of the trench 99, and the main surface 60A of the contact layer 60 on the side opposite to the side facing the block layer 50.

Subsequently, an electrode formation step is performed as a step S50. In this step S50, referring to FIGS. 10 and 2, an n-electrode 91 and a p-electrode 92 are formed on the semiconductor laminate 10 with the passivation film 80 formed in the step S40. Specifically, for example, a mask having openings in positions corresponding to the regions where the n-electrode 91 and the p-electrode 92 are to be formed is formed on the passivation film 80, and this mask is used to form the openings 81, 82 in the passivation film 80. Thereafter, the n-electrode 91 and the p-electrode 92 of appropriate electric conductors are formed by vapor deposition, for example. The above procedure completes the infrared light-receiving element 1 in the present embodiment. Thereafter, dicing, for example, is performed to obtain separate elements.

Embodiment 2

Figure 11:
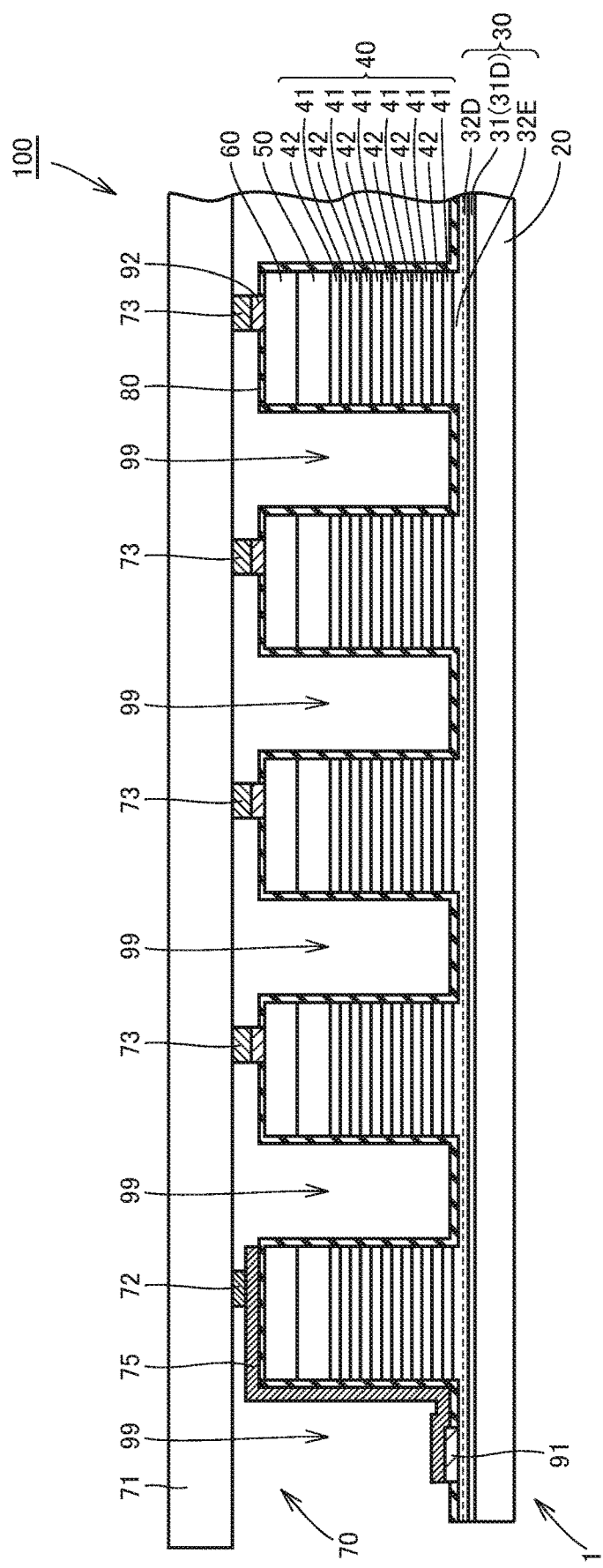
FIG. 11 is a schematic cross-sectional view showing the structure of a light-receiving element and a sensor in Embodiment 2.

A light-receiving element according to Embodiment 2, which is another embodiment of the semiconductor device according to the present disclosure, will now be described. Referring to FIGS. 11 and 2, an infrared light-receiving element 1 in Embodiment 2 has a structure in which, with the structure shown in FIG. 2 as a unit structure, a plurality of such unit structures are repeated in a direction along one main surface 20A of a substrate 20. The infrared light-receiving element 1 has a plurality of p-electrodes 92 corresponding to pixels, while only one n-electrode 91 is disposed.

More specifically, referring to FIG. 11, the n-electrode 91 of the infrared light-receiving element 1 in Embodiment 2 is formed on a bottom wall of a trench 99 located at an end in the direction along the substrate 20. Further, no p-electrode 92 is provided on a contact layer 60 adjacent to the trench 99 located at this end. An infrared sensor 100 in the present embodiment includes the infrared light-receiving element 1 having such a structure, and a read-out circuit (read-out integrated circuit; ROIC) 70 electrically connected to the infrared light-receiving element 1. The read-out circuit 70 is, for example, a complementary metal oxide semiconductor (CMOS) circuit.

A plurality of read-out electrodes (not shown) provided on a body 71 of the read-out circuit 70 and the plurality of p-electrodes 92 serving as pixel electrodes in the infrared light-receiving element 1 are electrically connected in one-to-one relationship via corresponding bumps 73. The infrared light-receiving element 1 also has wiring 75 formed to contact the n-electrode 91, and to extend along the bottom wall and the side wall of the trench 99 where the n-electrode 91 is located, to reach above the contact layer 60. The wiring 75 and a ground electrode (not shown) provided on the body 71 of the read-out circuit 70 are electrically connected via a bump 72. With this structure, optical information received for individual pixels of the infrared light-receiving element 1 is output from the p-electrodes 92 (pixel electrodes) to the corresponding read-out electrodes in the read-out circuit 70. The received optical information is integrated in the read-out circuit 70, so that a two-dimensional image, for example, is obtained.

Embodiment 3

A description will now be given of Embodiment 3 of the light-receiving element in the present disclosure. An infrared light-receiving element 1 in Embodiment 3 basically has a similar structure as and provides similar effects as the infrared light-receiving element 1 in Embodiment 2. Embodiment 3 differs from Embodiment 2 in that the unit structures corresponding to the pixels of the infrared light-receiving element 1 are isolated from each other, not by the trenches 99, but by regions where no impurity is diffused. The following description will focus primarily on the differences from Embodiment 2.

Figure 12:
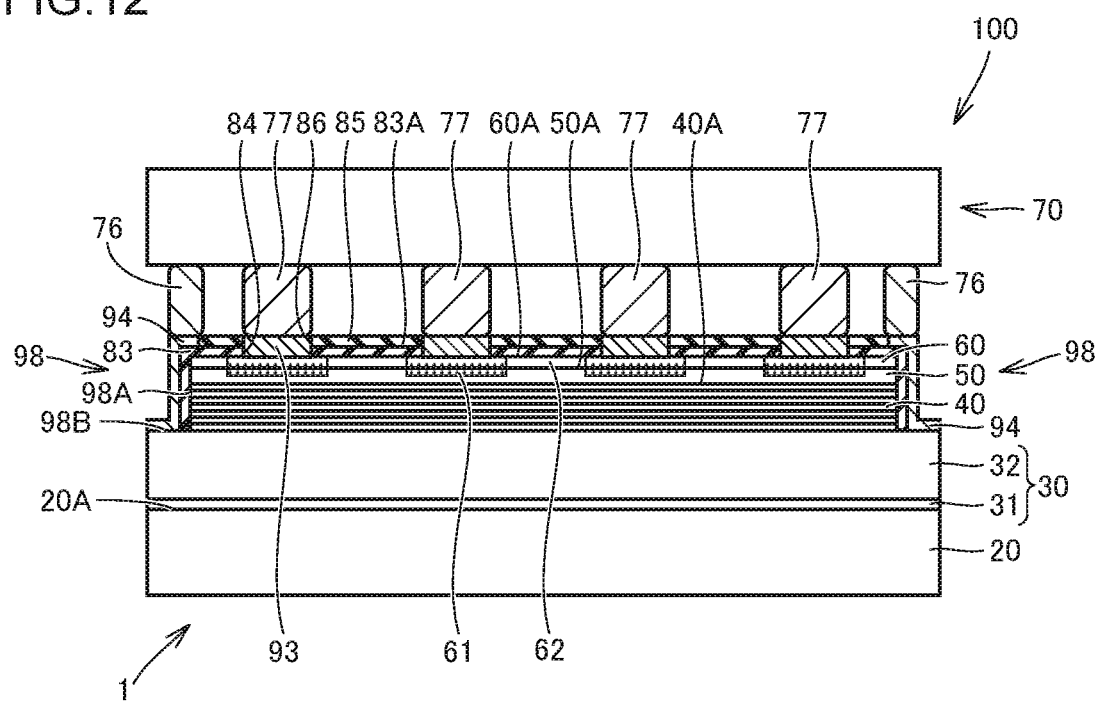
FIG. 12 is a schematic cross-sectional view showing the structure of a light-receiving element and a sensor in Embodiment 3.

Referring to FIG. 12, a contact layer 60 in the present embodiment is composed of undoped InP (ud-InP). In a plan view in the thickness direction, the contact layer 60 has a plurality of diffusion regions 61 formed at intervals, with an impurity diffused therein. The diffusion regions 61 have a p-type conductivity. Each diffusion region 61 is formed to extend, in the thickness direction, from a main surface 60A of the contact layer 60 on the side opposite to the side facing the block layer 50, down to reach the block layer 50. The impurity contained in the diffusion region 61 may be Zn, for example.

The diffusion region 61 can be formed for example as follows. Firstly, a semiconductor laminate 10 is produced in a similar procedure as in Embodiment 1. At this time, the contact layer 60 is undoped, as explained above. Next, a pair of trenches 98 are formed at respective ends in the direction along the substrate 20. Each trench 98 is formed to penetrate through the contact layer 60, the block layer 50, and the light-receiving layer 40, to have its bottom wall 98B located in the second buffer layer 32 is. Next, a mask layer 83 is formed to cover a side wall 98A of the trench 98 and the main surface 60A of the contact layer 60 on the side opposite to the side facing the block layer 50. The mask layer 83 is composed of silicon nitride, for example. Next, in the mask layer 83, a plurality of openings 84 are formed at intervals to penetrate therethrough in the thickness direction. The openings 84 are positioned in regions where the diffusion regions 61 are to be formed. Thereafter, the impurity such as Zn is diffused from the openings 84 of the mask layer 83. As a result, the diffusion regions 61 having the impurity diffused therein and regions 62 having no impurity diffused therein are formed in the contact layer 60. Each region 62 having no impurity diffused therein isolates the neighboring unit structures corresponding to the pixels of the infrared light-receiving element 1 from each other.

The infrared light-receiving element 1 includes a passivation film 85, n-electrodes 94, and p-electrodes 93. The passivation film 85 is disposed on and in contact with a main surface 83A of the mask layer 83 on the side opposite to the side facing the contact layer 60. The passivation film 85 has a plurality of openings 86 formed at intervals to penetrate therethrough in the thickness direction, so as to be aligned with the openings 84. Each p-electrode 93 is arranged to fill in the corresponding openings 84 and 86. The p-electrode 93 is disposed to contact the contact layer 60 exposed at the opening 84. The p-electrode 93 may be composed of gold (Au)/zinc (Zn), for example.

Each n-electrode 94 is disposed to contact the second buffer layer 32 at the bottom wall 98B of the trench 98, and to extend along and reach above the mask layer 83 that has been formed to cover the side wall 98A of the trench 98 and the main surface 60A of the contact layer 60. The n-electrode 94 may be composed of gold (Au)/germanium (Ge)/nickel (Ni), for example.

A plurality of read-out electrodes (not shown) in the read-out circuit 70 and the plurality of p-electrodes 93 in the infrared light-receiving element 1 are electrically connected via corresponding bumps 77. The ground electrodes (not shown) in the read-out circuit 70 and the n-electrodes 94 in the infrared light-receiving element 1 are electrically connected via corresponding bumps 76.

The infrared light-receiving element 1 in Embodiment 3 described above can also provide a highly sensitive light-receiving element as in Embodiment 1.

Example

An experiment was performed to confirm the structure of the semiconductor laminate in the present disclosure. The experimental procedure was as follows.

Firstly, a semiconductor laminate 10 was produced in a similar manner as in Embodiment 1 above. For the substrate 20, InP containing S as the impurity was used. For the first buffer layer 31, an InP layer having a thickness of 10 nm and containing Si as the impurity was formed while Sb was being introduced in the source gases. For the second buffer layer 32, an InGaAs layer having a thickness of 150 nm and containing Si as the impurity was formed while no Sb was being introduced in the source gases. As the light-receiving layer 40, 250 pairs of 5 nm-thick InGaAs first element layers 41 and 5 nm-thick GaAsSb second element layers 42 were alternately stacked. For the block layer 50, an ud-InGaAs layer having a thickness of 1000 nm was formed. For the contact layer 60, an InP layer having a thickness of 750 nm and containing Zn as the impurity was formed. In the semiconductor laminate 10 obtained, the concentration distribution of Sb was measured in the substrate 20, the buffer layer 30, and the light-receiving layer 40, in the thickness direction of the semiconductor laminate 10.

Figure 13:
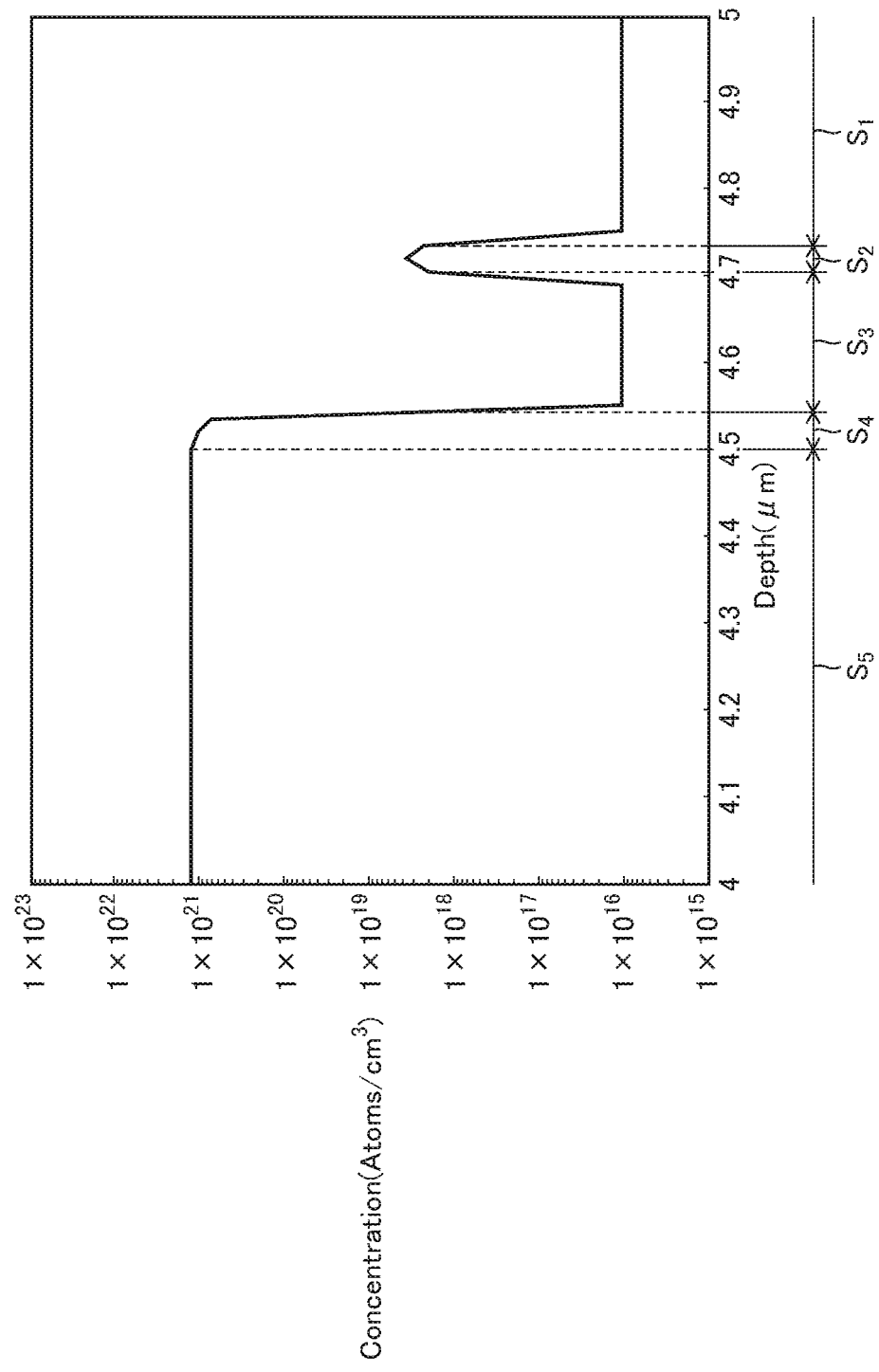
FIG. 13 is a diagram showing, by way of example, Sb concentration profile in the thickness direction of a semiconductor laminate.

The concentration distribution of Sb in the thickness direction of the semiconductor laminate 10 was measured by double-focus magnetic-sector SIMS, using an instrument manufactured by CAMECA. Sputtering for the SIMS analysis was performed using cesium ions ($Cs^+$). The cesium ion acceleration voltage was 15 keV. The beam diameter was 20 μm or less. The raster region was a square region with a side of 150 μm. The analysis region was a circular region with a diameter of 60 μm. The degree of vacuum during the measurement was $1 \times 10^{-7}$ Pa. In FIG. 13, the horizontal axis represents distance in the thickness direction of the semiconductor laminate 10, and the vertical axis represents Sb concentration ($cm^{-3}$). It should be noted that the measurement limit (lower limit) of the Sb concentration is $1 \times 10^{16}$ $cm^{-3}$. The Sb concentration of $1 \times 10^{16}$ $cm^{-3}$ in FIG. 13 is determined to indicate the Sb concentration of the measurement limit or less. Referring to FIG. 13, the region $S_1$ corresponds to the substrate 20. The region $S_2$ corresponds to the first buffer layer 31. The regions $S_3$ and $S_4$ correspond to the second buffer layer 32. The region $S_5$ corresponds to the light-receiving layer 40. The concentration of Sb increases abruptly at the boundary of the regions $S_1$ and $S_2$. In the region $S_2$, a region having a higher concentration of Sb than the region $S_1$ has been formed. This demonstrates that the first layer 31D that is high in Sb concentration has been formed in the region $S_2$. In the region $S_2$, the ratio of the difference between the maximum value and the minimum value of the Sb concentration with respect to the maximum value is 47%. The Sb concentration decreases abruptly at the boundary of the regions $S_2$ and $S_3$. The region $S_3$ corresponds to the second layer 32D. The Sb concentration increases abruptly at the boundary of the regions $S_3$ and $S_4$. The Sb concentration increases in the region $S_4$ conceivably because of Sb diffused from the light-receiving layer 40. When the first buffer layer 31 is formed to include the first layer 31D in this manner, surface flatness of the first buffer layer 31 is improved as compared to the case including no such a layer. This leads to improved surface flatness of the second buffer layer 32, thereby ensuring excellent crystallinity of the light-receiving layer 40.

It should be understood that the embodiments and example disclosed herein are illustrative and non-restrictive in every respect. The scope of the present invention is defined by the terms of the claims, rather than by the foregoing description, and is intended to include any modifications within the scope and meaning equivalent to the terms of the claims.

What is claimed is:

1. A semiconductor laminate comprising:
   a substrate composed of InP;
   a first buffer layer disposed on the substrate, and comprised of at least a first layer arranged to include a first main surface as a main surface of the first buffer layer on a substrate side of the first buffer layer, wherein the first buffer layer is composed of InP and contains less than $1 \times 10^{21}$ $cm^{-3}$ and wherein the first layer has a higher concentration of Sb than the substrate; and
   a second buffer layer disposed on the first buffer layer, and comprised of at least a second layer arranged to include a second main surface as a main surface of the second buffer layer on a first buffer layer side of the second buffer layer, wherein the second buffer layer is composed of InGaAs, and wherein the second layer has a lower concentration of Sb than the first layer of the first buffer layer.

2. The semiconductor laminate according to claim 1, wherein the concentration of Sb in the first layer is $1\times10^{16}$ cm$^{-3}$ or more.

3. The semiconductor laminate according to claim 2, wherein the concentration of Sb in the first layer is $1\times10^{17}$ cm$^{-3}$ or more.

4. The semiconductor laminate according to claim 1, wherein the concentration of Sb in the second layer is $1\times10^{20}$ cm$^{-3}$ or less.

5. The semiconductor laminate according to claim 1, wherein in Sb concentration distribution in a thickness direction of the first buffer layer, a ratio of a difference between a maximum value and a minimum value of the concentration of Sb with respect to the maximum value is 50% or less.

6. The semiconductor laminate according to claim 1, wherein the first buffer layer has a thickness of 10 nm or more and 50 nm or less.

7. The semiconductor laminate according to claim 1, further comprising a light-receiving layer composed of a III-V compound semiconductor and disposed on the second buffer layer.

8. The semiconductor laminate according to claim 7, wherein the light-receiving layer has a type-II quantum well structure.

9. The semiconductor laminate according to claim 8, wherein the type-II quantum well structure is a multiple quantum well structure including pairs of layers of In$_x$Ga$_{1-x}$As (where x is 0.38 or more and 1 or less) and GaAs$_{1-y}$Sb$_y$ (where y is 0.36 or more and 1 or less), or pairs of layers of Ga$_{1-u}$In$_u$N$_v$As$_{1-v}$ (where u is 0.4 or more and 0.8 or less, and v is more than 0 and not more than 0.2) and GaAs$_{1-y}$Sb$_y$ (where y is 0.36 or more and 0.62 or less).

10. A light-receiving element comprising:
the semiconductor laminate according to claim 1; and
electrodes formed on the semiconductor laminate.

11. The semiconductor laminate according to claim 1, wherein the first buffer layer further includes a third layer disposed on the first layer, the third layer having a lower concentration of Sb than the first layer.

12. The semiconductor laminate according to claim 1, wherein the second buffer layer further includes a fourth layer disposed on the second layer.

13. A semiconductor laminate comprising:
a substrate composed of InP;
a first buffer layer disposed on the substrate, and comprised of at least a first layer arranged to include a first main surface as a main surface of the first buffer layer on a substrate side of the first buffer layer, wherein the first buffer layer is composed of InP and contains less than $1\times10^{21}$ cm$^{-3}$ Sb, and wherein the first layer has a concentration of Sb of $1\times10^{17}$ cm$^{-3}$ cm or more; and
a second buffer layer disposed on the first buffer layer, and comprised of at least a second layer arranged to include a second main surface as a main surface of the second buffer layer on a first buffer layer side of the second buffer layer, wherein the second buffer layer is composed of InGaAs and contains a lower concentration of Sb than the first layer of the first buffer layer, and wherein a concentration of Sb in the second layer is $1\times10^{17}$ cm$^{-3}$ or less.

14. The semiconductor laminate according to claim 13, further comprising a light-receiving layer composed of a III-V compound semiconductor and disposed on the second buffer layer.

15. A light-receiving element comprising:
the semiconductor laminate according to claim 13; and
electrodes formed on the semiconductor laminate.

16. The semiconductor laminate according to claim 13, wherein the first buffer layer further includes a third layer disposed on the first layer, the third layer having a lower concentration of Sb than the first layer.

17. The semiconductor laminate according to claim 13, wherein the second buffer layer further includes a fourth layer disposed on the second layer.

* * * * *